(12) United States Patent
Westlake et al.

(10) Patent No.: US 10,994,527 B2
(45) Date of Patent: May 4, 2021

(54) PLANARITY ALIGNMENT OF STENCILS AND WORKPIECES

(71) Applicant: ASM Assembly Systems Singapore Pte. Ltd., Singapore (SG)

(72) Inventors: Michael Westlake, Weymouth (GB); George Bareham, Weymouth (GB); Simon Pape, Yeovil (GB); Richard Cockram, Broadstone (GB); David Foggie, Dorchester (GB); Charles Tones, Swanage (GB)

(73) Assignee: ASM ASSEMBLY SYSTEMS SINGAPORE PTE. LTD.

( * ) Notice: Subject to any disclaimer, the term of this patent is extended or adjusted under 35 U.S.C. 154(b) by 171 days.

(21) Appl. No.: 16/180,643

(22) Filed: Nov. 5, 2018

(65) Prior Publication Data
US 2019/0134975 A1 May 9, 2019

(30) Foreign Application Priority Data
Nov. 7, 2017 (GB) ...................... 1718374

(51) Int. Cl.
| | |
|---|---|
| *B41F 15/26* | (2006.01) |
| *B41F 27/00* | (2006.01) |
| *H05K 3/12* | (2006.01) |
| *B41F 15/08* | (2006.01) |
| *B41F 15/36* | (2006.01) |
| *B25B 1/24* | (2006.01) |

(Continued)

(52) U.S. Cl.
CPC .............. *B41F 27/005* (2013.01); *B25B 1/18* (2013.01); *B25B 1/241* (2013.01); *B25B 5/061* (2013.01); *B25B 5/145* (2013.01); *B25B 5/163* (2013.01); *B41F 15/0881* (2013.01); *B41F 15/18* (2013.01); *B41F 15/26* (2013.01); *B41F 15/34* (2013.01); *B41F 15/36* (2013.01); *F16C 29/001* (2013.01); *F16C 29/007* (2013.01); *F16C 29/025* (2013.01); *F16C 29/046* (2013.01); *F16C 29/126* (2013.01); *H05K 3/1225* (2013.01); *B41P 2215/112* (2013.01); *B41P 2215/114* (2013.01); *F16C 2324/16* (2013.01)

(58) Field of Classification Search
CPC .... B41F 27/005; B41F 15/0881; B41F 15/18; B41F 15/26; B41F 15/34; B41F 15/36; B41P 2215/112; B41P 2215/114; H05K 3/1225
USPC .................................................. 101/123, 126
See application file for complete search history.

(56) References Cited

U.S. PATENT DOCUMENTS

| | | | | |
|---|---|---|---|---|
| 4,254,707 A | * | 3/1981 | Lambert ............. | B41F 15/0818 101/123 |
| 4,905,592 A | * | 3/1990 | Sorel ....................... | B41F 15/36 101/123 |

(Continued)

FOREIGN PATENT DOCUMENTS

| | | |
|---|---|---|
| CN | 103388725 B | 3/2016 |
| DE | 102011005158 A1 | 9/2012 |

(Continued)

*Primary Examiner* — Leslie J Evanisko
(74) *Attorney, Agent, or Firm* — Ostrolenk Faber LLP

(57) ABSTRACT

An alignment system for a workpiece printing machine comprises a stencil support and a workpiece support, and a planarity control mechanism having at least two actuators arranged to effect relative rotation of the stencil support and workpiece support about both the horizontal axes.

17 Claims, 10 Drawing Sheets

(51) Int. Cl.
  *B25B 5/16* (2006.01)
  *F16C 29/00* (2006.01)
  *B25B 1/18* (2006.01)
  *B25B 5/14* (2006.01)
  *F16C 29/02* (2006.01)
  *F16C 29/12* (2006.01)
  *F16C 29/04* (2006.01)
  *B25B 5/06* (2006.01)
  *B41F 15/18* (2006.01)
  *B41F 15/34* (2006.01)

(56) References Cited

U.S. PATENT DOCUMENTS

| 5,427,364 | A | 6/1995 | Zborschil |
| 6,065,399 | A | 5/2000 | Eppinger |
| 2002/0112622 | A1 | 8/2002 | Rosenberg |
| 2011/0297020 | A1 | 12/2011 | Tanaka |
| 2015/0216058 | A1 | 7/2015 | Mantani |

FOREIGN PATENT DOCUMENTS

| DE | 102014110894 A1 | 2/2016 | |
| EP | 0499386 A1 | 8/1992 | |
| EP | 2988582 A1 | 2/2016 | |
| EP | 3181359 A1 | 6/2017 | |
| GB | 2351258 A * | 12/2000 | ............... G03F 9/00 |
| JP | H09-109363 A | 4/1997 | |
| JP | 2003-291301 A | 10/2003 | |
| JP | 2005-047066 A | 2/2005 | |
| JP | 2007-105825 A | 4/2007 | |
| JP | 2009-006588 A | 1/2009 | |
| JP | 2016-175362 A | 10/2016 | |
| KR | 1020140040116 | 4/2014 | |
| TW | 239088 B | 1/1995 | |
| WO | WO 91/12114 A1 | 8/1991 | |
| WO | WO 2006/100116 A1 | 9/2006 | |
| WO | WO 2007/069754 A1 | 6/2007 | |
| WO | WO-2012119904 A1 * | 9/2012 | .......... B41F 15/0881 |

* cited by examiner

PLANARITY ALIGNMENT OF STENCILS AND WORKPIECES

This invention relates to an alignment system, a clamp assembly, a printing machine and a method for printing a planar workpiece.

BACKGROUND AND PRIOR ART

Industrial screen-printing machines typically apply print media, such as solder paste or conductive ink, onto a planar workpiece, such as a circuit board, by applying a medium (e.g. solder paste) through a stencil using an angled blade or squeegee. To ensure that the stencil aligns correctly with the workpiece, the relative position of markers provided on the stencil and workpiece, in the plane of the workpiece (which is conventionally denoted the X-Y plane and is generally horizontal), are measured and subsequently aligned. One or more cameras may be used to optically measure the positions of the markings.

Typically, the stencil and workpiece are then aligned in the X-Y plane by means of actuators which act on a stencil support to move the stencil supported thereon relative to the workpiece. The extent of movement required is determined by the preceding optical measurement. Such alignment normally occurs over the single X-Y plane, using two degrees of freedom. Subsequently, the stencil is brought into contact (or near contact) with the workpiece, by effecting relative movement between the stencil and workpiece in a direction normal to the workpiece (conventionally denoted as movement along the Z-axis).

A known alignment system 1 providing this functionality is schematically shown in FIG. 1. Here the system 1 is shown from above, looking down onto the X-Y plane, the X, Y and Z axis directions being shown for clarity. A stencil support 2 is provided for supporting a stencil 3 thereon in the X-Y plane. The stencil is arranged to overlie a workpiece support 4, upon which a workpiece is supported in use. The relative positions, in the X-Y plane, of the stencil 3 and workpiece are optically determined by a camera system (not shown). So that the stencil support 2 may be moved both translationally and rotationally in the X-Y plane, and relative to the printing machine, three actuators are statically mounted on the printing machine to mechanically cooperate with the stencil support 2. Two alignment actuators 7, 8 act at lateral areas of the stencil support 2 to impel the stencil support 2 to move in the ±X direction. The other alignment actuator 9 acts at a relatively central area of the stencil support 2 to impel the stencil support 2 to move in the ±X direction. It can be seen that if actuator 9 is activated on its own, the stencil support 2 will be translated along the Y axis, while it may be translated along the X axis if both actuators 7 and 8 are activated in tandem. Rotation of the stencil support 2, or combined rotation and translation, may be achieved by selectively activating a combination of actuators 7, 8 and 9. All of the alignment actuators 7, 8, 9 are held in fixed positions by mounting on the printing machine, for example on a static structure or frame of the printing machine.

While in this system the stencil support is actuated to move relative to the workpiece support, in other systems actuators may act directly on the workpiece support to achieve relative movement.

After alignment, the print medium is applied to the workpiece through the stencil by depositing the medium onto the upper surface of the stencil and sweeping the squeegee across the upper surface in or parallel to the X-Y plane, forcing the print medium through the apertures of the stencil. Subsequently, the workpiece and stencil are separated.

It has been found through extensive research that control of the angle of separation between the stencil and workpiece is crucial to controlling print quality. However, a problem exists in that known printing machines have no ability to automatically correct for planar alignment errors outside the initial machine build stage, or during subsequent manual calibrations.

The present invention seeks to address this problem and achieve multi-planar alignment (with three degrees of freedom) of printing stencils to workpieces within an industrial screen-printing machine.

In accordance with the present invention this aim is achieved by providing a planarity control mechanism effective to selectively rotate the stencil support about the X and Y axes so that the stencil is parallel, or at a predetermined angle, with the workpiece.

This aim is also achieved in accordance with the present invention by the provision of a clamp assembly which is operable to permit rotation and translation of the stencil support during alignment and clamp the stencil support to prevent local movement along the X, Y and Z-axes when aligned.

SUMMARY OF THE INVENTION

In accordance with a first aspect of the present invention there is provided an alignment system for a workpiece printing machine, comprising:
a stencil support for supporting a substantially planar stencil in use,
a workpiece support for supporting a planar workpiece in an X-Y plane in use, the X-Y plane being defined as that plane which includes orthogonal X and Y axes, and
a planarity control mechanism comprising an actuator arranged to effect relative rotation of the stencil support and workpiece support about at least one of the X and Y axes.

In accordance with a second aspect of the present invention there is provided a clamp assembly, comprising:
first and second mutually opposed clamping surfaces for clamping a rigid structure therebetween, and
a clamping actuator on which the first clamping surface is mounted, operative to switch the clamp assembly between a first, unclamped state and a second, clamped state in which clamped state said rigid structure is clamped between the first and second clamping surfaces, said switching being effected by the clamping actuator moving the first clamping surface along a clamping axis towards the second clamping surface,
wherein at least one of the first and second clamping surfaces comprises a bearing, such that the rigid structure is movable relative to the said clamping surface via said bearing when the clamp assembly is in the first, unclamped state.

In accordance with a third aspect of the present invention there is provided a printing machine comprising the alignment system of the first aspect.

In accordance with a fourth aspect of the present invention there is provided a method for printing a planar workpiece with a conductive medium, comprising the steps of:
i) providing a printing machine having a workpiece support for supporting a planar workpiece in an X-Y plane, and a stencil support for supporting a substantially planar stencil, ii) loading a stencil into the stencil support, iii) measuring the distance of a plurality of points of the stencil relative to the X-Y plane, iv) rotating the stencil support relative to the workpiece support about at least one of the X and Y axes until the stencil is at a required orientation to the X-Y plane, v) loading a workpiece onto the workpiece support such that it is located below the stencil, and vi) printing conductive medium onto the workpiece via the stencil.

Preferably, step i) comprises providing a printing machine in accordance with the third aspect.

Advantageously, the method may comprise the step of calibrating the printing machine by measuring a reference position of the workpiece or workpiece support.

Other specific aspects and features of the present invention are set out in the accompanying claims.

BRIEF DESCRIPTION OF THE DRAWINGS

The invention will now be described with reference to the accompanying drawings (not to scale), in which.

DETAILED DESCRIPTION OF THE PREFERRED EMBODIMENTS OF THE INVENTION

Figure 1:
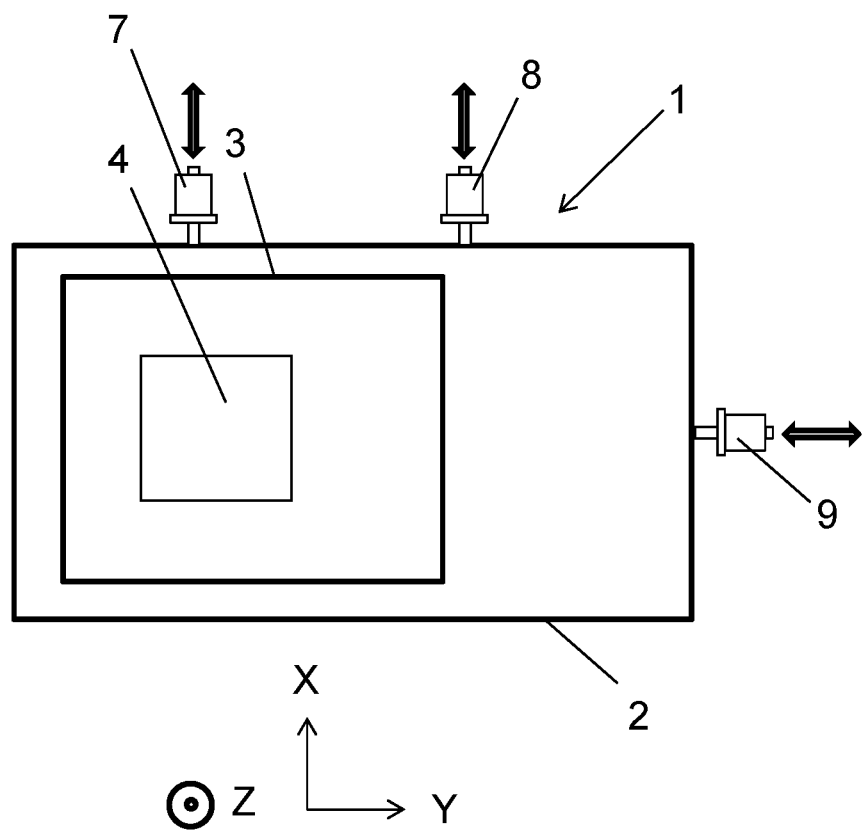
FIG. 1 schematically shows a known alignment system from above.
Figure 2:
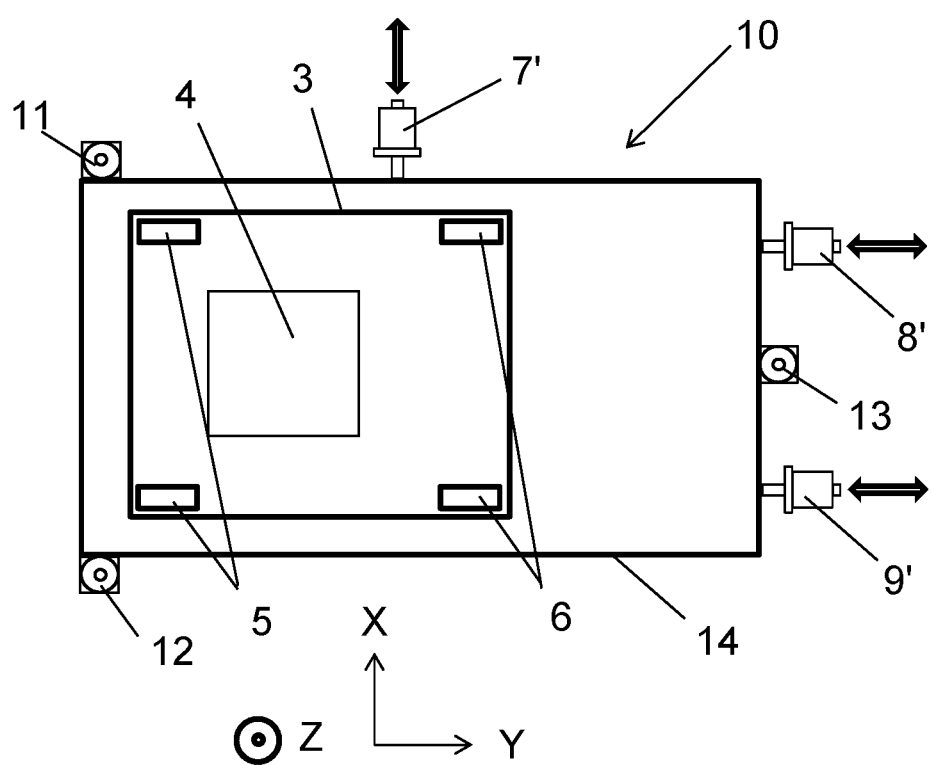
FIG. 2 schematically shows an alignment system in accordance with an embodiment of the present invention from above.

An alignment system 10 in accordance with an embodiment of the present invention is schematically shown in FIG. 2. The alignment system 10 is adapted for mounting within a printing machine (not shown), the printing machine comprising a static supporting structure on which many components of the printing machine, including a workpiece support 4, are mounted. The alignment system 10 shown has many similarities with that of FIG. 1, and so like reference numerals are retained where appropriate. In particular, workpiece support 4 and a camera system for determining alignment in the X-Y plane are also present in the illustrated system. One difference is that the X-Y plane alignment actuators 7', 8', 9' are rearranged with respect to the set-up of FIG. 1, so that a single alignment actuator 7' is positioned relatively centrally of a stencil support 14 to impel the stencil support 14 to move in the ±X direction. The other two alignment actuators 8', 9' act at lateral areas of the stencil support 14 to impel the stencil support 14 to move in the ±Y direction. It can be seen that if actuator 7' is activated on its own, the stencil support 14 will be translated, relative to the printing machine structure, along the X axis, while it may be translated along the Y axis if both actuators 8' and 9' are activated in tandem. Rotation of the stencil support 14, or combined rotation and translation, may be achieved by selectively activating a combination of actuators 7', 8' and 9'.

With the present alignment system 10, a planarity control mechanism is further provided for enabling relative rotation of a stencil support 14, for supporting a stencil 3 in the X-Y plane, and the workpiece support 4, selectively about both the X and Y axes. In this embodiment, the stencil support 14 is adapted to act as an alignment frame, so that it may be rotated selectively about the X and Y axes by means of three spaced alignment clamps 11, 12, 13 positioned around and incorporated into the stencil support 14. To this end, the structure of the printing machine is provided with respective lugs (see FIG. 5) projecting therefrom, which mechanically cooperate with respective alignment clamps 11, 12, 13 as will be described in more detail below. In this embodiment, alignment clamps 11 and 12 are movable alignment clamps, capable of moving (i.e. lifting) the stencil support 14 with respect to the lugs to change the local distance along the Z-axis, while alignment clamp 13 is a fixed clamp, i.e. being incapable of effecting movement between the stencil support 14 and a lug, which acts as a pivot point. In other embodiments, alignment clamp 13 may also be movable. Both fixed and movable alignment clamps are described in more detail below.

A pair of front measurement sensors 5 and a pair of rear measurement sensors 6 are provided above the stencil support 14. These are effective to determine the position of a stencil mounted on the stencil support 14 in the Z-direction, as will be described in more detail below.

As noted above, in this embodiment, the stencil support 14 acts as an alignment frame, while workpiece support 4 remains spatially fixed relative to the structure of the printing machine. It should be noted that in other embodiments (not shown), equally the workpiece support may be adapted to act as an alignment frame. In this case, the workpiece support may be aligned about the X and Y axes and clamped as required, while the stencil support remains spatially fixed with respect to the printing machine structure.

Figure 3A:
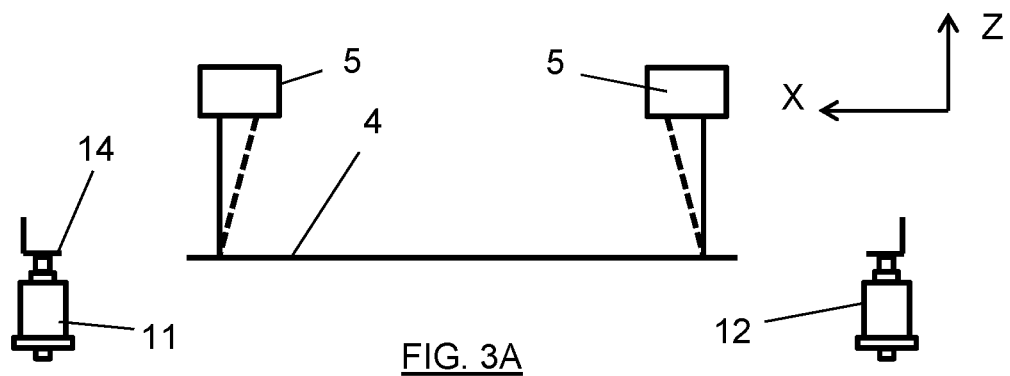
FIGS. 3A-C schematically show a sequence of steps in a planarity alignment process in accordance with the present invention from a front view looking along a positive Y direction.
Figure 3B:
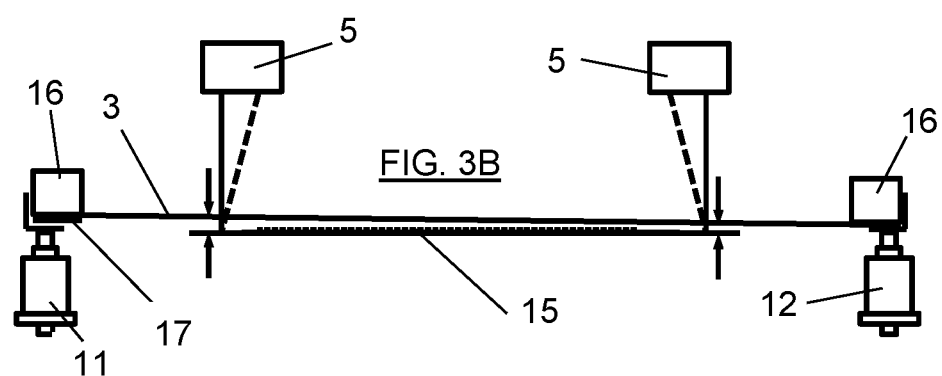
Figure 3C:
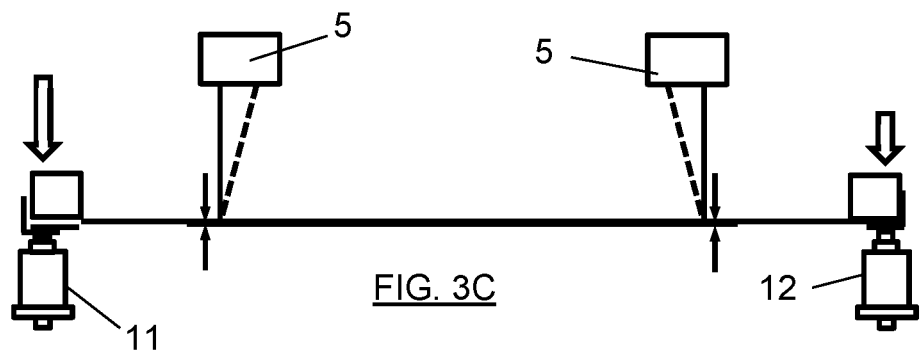
Figure 4A:
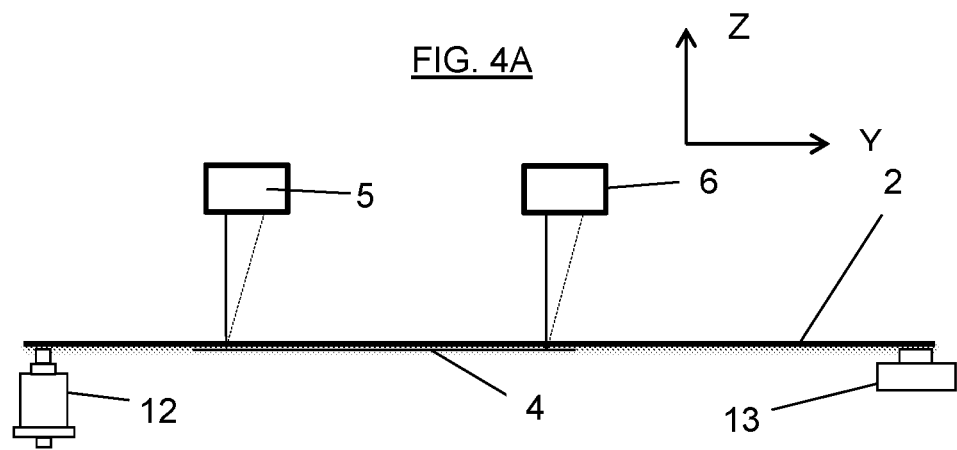
FIGS. 4A-C schematically show the sequence of steps of FIGS. 3A-C from a side view looking along an X-direction.
Figure 4B:
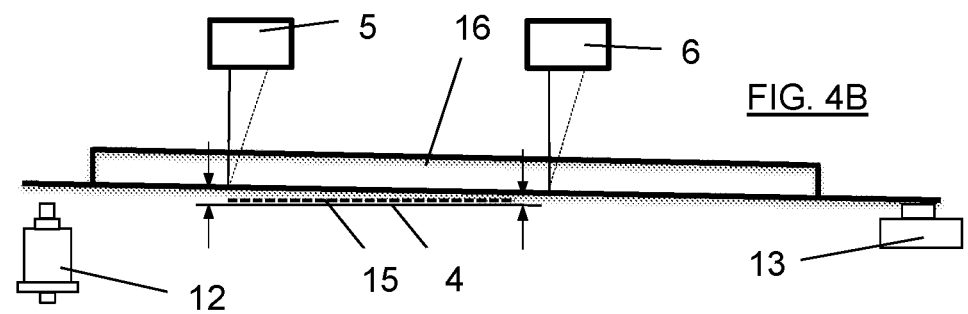
Figure 4C:
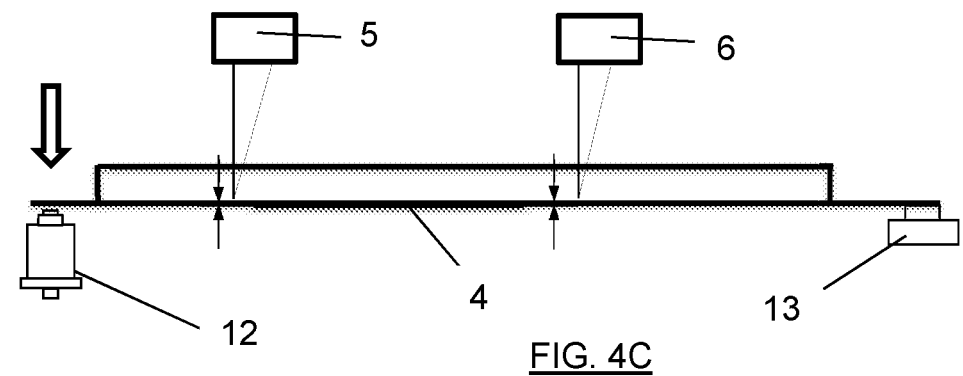

FIGS. 3A-C schematically show a sequence of steps in a planarity alignment process for aligning the stencil 3 and workpiece using the apparatus of FIG. 2, taken from a front view, i.e. looking in the positive Y direction. Similarly, FIG. 4A-C schematically show this same sequence but taken from a side view, i.e. looking along the X direction. Comparison of FIGS. 3 and 4 therefore shows how orthogonal components of misalignment may be corrected. For clarity, both FIGS. 3 and 4 omit the X and Y alignment actuators. For the avoidance of doubt, alignment within the X-Y plane is achieved by these actuators in a similar way as is known in the prior art system shown in FIG. 1.

FIG. 3A and FIG. 4A show an initial step, in which no workpiece is yet loaded onto workpiece support 4, and no stencil is yet loaded onto stencil support 14. The alignment clamps 11, 12 and 13 are caused to be in a clamped state in which they clamp the stencil support 14 to hold it firmly in place with respect to the printing machine. Further details of the clamping mechanism are set out below. Workpiece support 4, the upper surface of which defines the X-Y plane, acts as a datum for an initial calibration measurement made by measurement sensors 5 and 6. Subsequent measurements may then be corrected based on the determined position of the workpiece support 4. It will be apparent to those skilled in the art that the measurement sensors 5 and 6 must be effective to measure distance, and there are a variety of techniques which may be utilised to achieve this. As shown in FIGS. 3 and 4, each measurement sensor is a laser device, which emits laser light downwardly and detects light reflected back. The present invention is not so limited however, and other measurement systems, such as ultrasonic or capacitive systems for example, may be used.

FIG. 3B and FIG. 4B show a subsequent step in which a planar workpiece 15 has been loaded onto the workpiece support 4 so that it is supported in the X-Y plane, and a stencil 3 has been loaded into the stencil support 14. In practice, and as is well-known in the art, the stencil 3 is held under tension within a surrounding rectangular stencil frame 16, such as DEK's VectorGuard® frame system, with the frame contacting and resting on the stencil support 14.

It can be seen from FIG. 3B that in this example the stencil 3 is misaligned with the workpiece 15 along the X direction, i.e. at a position X=0 the distance between the stencil 3 and workpiece 15 is smaller than at a distance X=n (n>0). There could be various causes of such misalignment, such as, for example, a foreign body stuck to the underside of the stencil frame 16, such as glue leaking through the stencil frame, or a damaged frame which has been caused to warp. In FIG. 3B, a representative cause of misalignment is shown at 17, as being an arbitrary object located between the stencil frame 16 and stencil support 14. Similarly, FIG. 4B shows that in this example the stencil 3 is misaligned with the workpiece 15 along the Y direction, i.e. at a position Y=0 the distance between the stencil 3 and workpiece 15 is greater than at a distance Y=n (n>0). In this case therefore, the maximum misalignment occurs in the vicinity of alignment clamp 11. The extent of misalignment is determined by comparing the measurements taken by front and rear measurement sensors 5, 6. Since measurement sensors 5, 6 are spaced in both X and Y directions, the planarity of the stencil 3 with respect to both the X and Y axes can be determined.

In order to perform correction for misalignment, the alignment clamps 11, 12 and 13 are caused to switch to an unclamped state, in which the stencil support 14 is movable relative to the printing machine.

FIG. 3C and FIG. 4C show a subsequent step following correction for misalignment. As can be seen, in this case both alignment clamps 11 and 12 have been caused to move downwards (i.e. in the negative Z direction), so as to cause relative rotation of the stencil support 14 and workpiece support 4 about the X axis, with fixed alignment clamp 13 acting as a pivot point. This acts to correct the misalignment along the Y axis direction as determined by the measurement sensors 5, 6. Additionally, alignment clamp 11 has been caused to move downwards more than alignment clamp 12, so as to cause relative rotation of the stencil support 14 and workpiece support 4 about the Y axis, and thus correct the misalignment along the X axis direction. Following correction, in this case the stencil 3 is caused to lie substantially parallel to the workpiece 15, ready for a subsequent printing process to be conducted. The measurement sensors 5, 6 may be used to obtain confirmation that the alignment of the workpiece 15 and stencil 3 are as required, and corrections made if necessary. Alignment within the X-Y plane may occur before, after or during this planarity alignment process. Following all alignment steps, the alignment clamps 11, 12 and 13 are caused to be in a clamped state in which they clamp the stencil support 14 to hold it firmly in place with respect to the printing machine.

As noted above, in some embodiments (not shown) the fixed alignment clamp 13 could be replaced with a movable alignment clamp, for example taking a similar form to alignment clamps 11 and 12. Such an arrangement is equally able to effect relative rotation of the stencil support 14 and workpiece support 4 so as to effect the desired planarity alignment; in fact a greater degree of rotation is possible. In addition, such an arrangement has the benefit that the distance between stencil support 15 and workpiece support 4 in the Z direction may be adjusted as required. However, these benefits are at least partially offset by the resulting increase in apparatus complexity and additional space required.

It should be noted that in some instances the optimum arrangement of stencil and workpiece might not be parallel. For example, by setting the stencil and workpiece planes to be slightly off-parallel, separation of the workpiece and stencil following a printing process may be effected in a controlled manner. As specific examples, the alignments could be set so that separation occurs from front to back (positive Y direction) or laterally (positive or negative X direction). Furthermore, the alignment may be adjusted during separation of the stencil and workpiece, so that printing may be performed with a parallel stencil and workpiece, but full control is obtained over the subsequent separation.

Those skilled in the art will appreciate from the above description that the alignment clamps 11, 12 and 13 perform three functions:

i) to permit the alignment frame (in this embodiment the stencil support 14) to move freely in the X-Y plane during X-Y alignment, i.e. while the alignment clamps 11, 12 and 13 are in an unclamped state;

ii) to act on the alignment frame to cause selective rotation of the alignment frame about the X and Y axes while in the unclamped state; and iii) to effect a clamped state in which the stencil support 14 is clamped firmly when it is aligned as required with respect to all axes.

Figure 5:
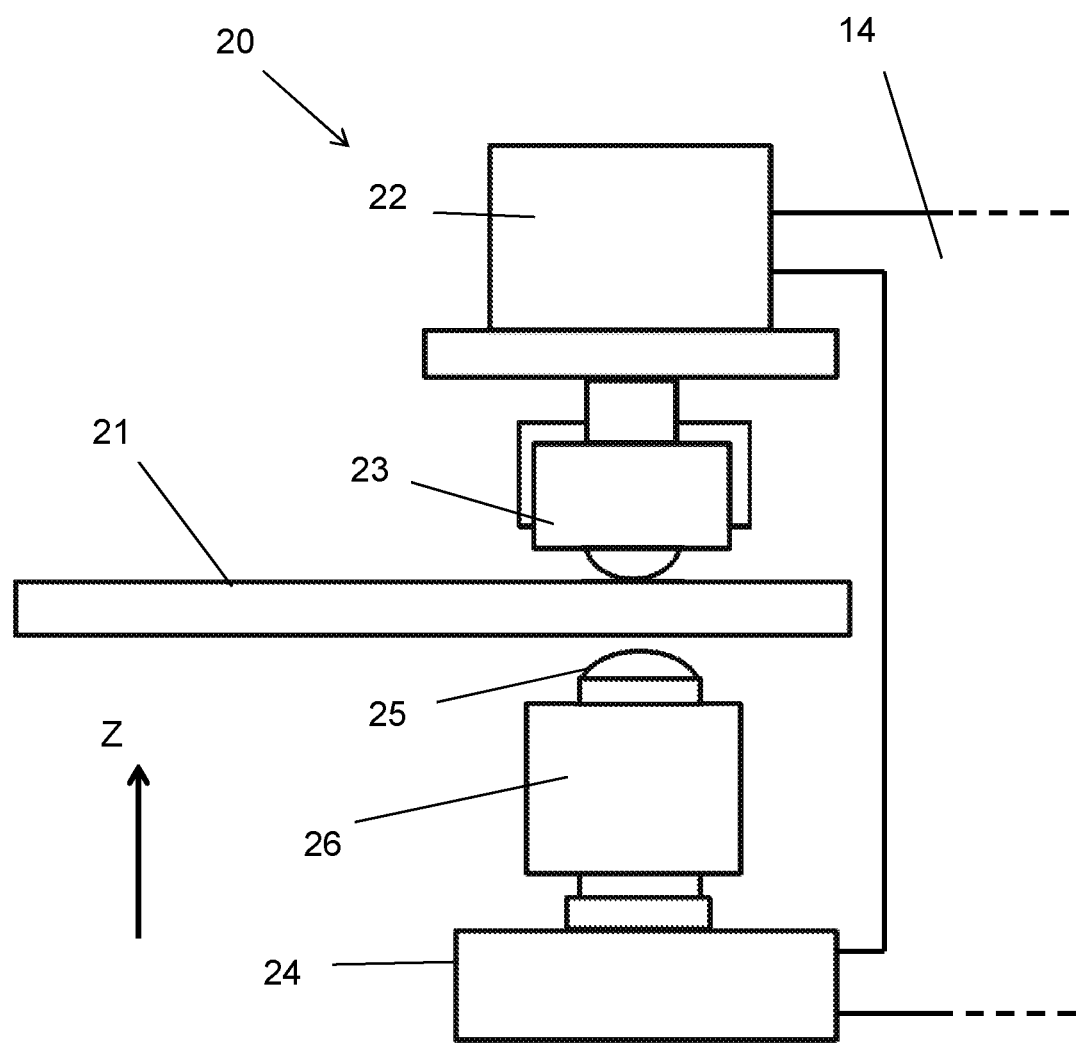
FIG. 5 schematically shows a movable alignment clamp in accordance with an embodiment of the present invention.

FIG. 5 schematically shows a clamp assembly in the form of a movable alignment clamp 20 in accordance with an embodiment of the present invention. The alignment clamp 20 is arranged to clamp onto a portion of the printing machine structure. As shown, the structure is provided with a plurality of rigid projecting lugs 21, which structures are provided for mechanical cooperation with respective alignment clamps. Each projecting lug 21 takes the form of a plate lying in a plane parallel to the X-Y plane. An upper part of alignment clamp 20 is positioned above the lug 21, and a lower part of alignment clamp 20 is positioned below the lug 21, so as to be located in line with the upper part. The upper part includes a linear positioning or planarity actuator 22, the output of which is mechanically connected to a ball transfer bearing 23, which rests on the upper surface of lug 21 and also acts as an upper clamping surface. The planarity actuator 22 is operative to move the alignment frame, i.e. in this case the stencil support 14, relative to, and in reaction against, an external surface, in this case the upper surface of lug 21. The lower part includes a linear clamping actuator 24, the output of which is mechanically connected along a clamping axis to a frictional clamping element 25 via a linear guide 26. Frictional clamping element 25 is shown in this embodiment as a projection having a domed surface, however frictional clamping element 25 may alternatively comprise other forms of angularly compliant surface. The frictional clamping element 25 acts as a lower clamping surface. Use of an angularly compliant surface enables the lug 21 to be clamped at an inclined angle to the clamping axis.

In this embodiment, the alignment clamp 20 is incorporated into the stencil support 14, only a portion thereof being visible in FIG. 5, so that the stencil support 14 acts as a yoke for the alignment clamp 20. Both the clamping actuator 24 and the planarity actuator 22 are controlled by a separate control means (not shown) such as a computer, processor or the like, which is provided at or remote from the printing machine and adapted to receive measurement information from the front and rear measurement sensors 5, 6 (see FIG. 2).

During alignment, when the stencil support 14 is loaded into the printing machine, each alignment clamp is switched to an unclamped state. In this state, the ball transfer bearing 23 of each alignment clamp rests on a respective lug 21, on which it is free to roll, thus enabling the stencil support 14 to be aligned in the X-Y plane. The planarity of the stencil support 14 is aligned by operating the planarity actuator 22 to raise or lower the stencil support 14 along the Z axis until the required position is reached, as determined by the control means in dependence on the output received from the measurement sensors. Clamping of the stencil support 14 is then effected by switching to a clamped state. To effect this, the clamping actuator 24 is operated to move the frictional clamping element 25 upwardly along a clamping axis which is normal to the plane of the stencil support 14, this movement being guided by the linear guide 26. The upward movement is continued until the lug 21 is firmly clamped between the frictional clamping element 25 and ball transfer bearing 23.

Figure 6:
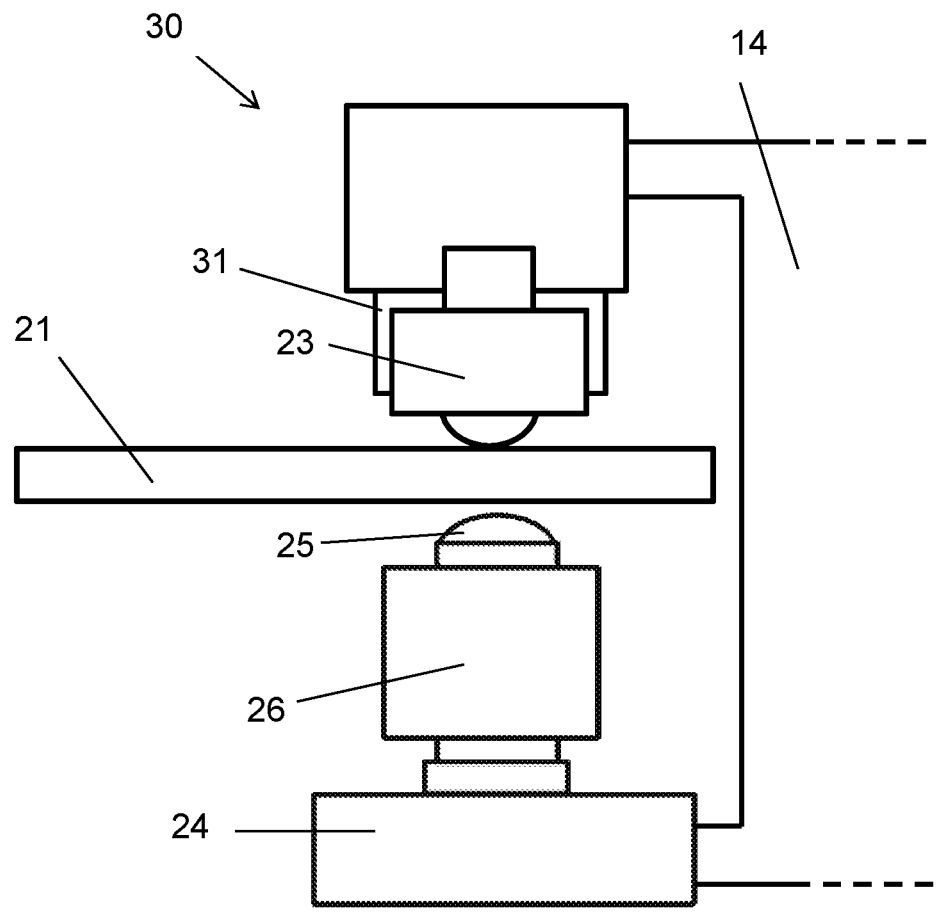
FIG. 6 schematically shows a fixed alignment clamp in accordance with a further embodiment of the present invention.

FIG. 6 schematically shows a fixed alignment clamp 30 in accordance with a further embodiment of the present invention. This alignment clamp 30 has many parts in common with the movable alignment clamp 20 of FIG. 5, and the reference numerals have been retained where appropriate. The lower part of fixed alignment clamp 30 is identical to that of movable alignment clamp 20. Here though there is no planarity actuator provided—instead, the ball transfer bearing 23 is mounted on a static nut 31.

With this fixed alignment clamp 30, clamping is effected in the same manner as for movable alignment clamp 20, so that the clamping actuator 24 is operated to cause the lug 21 to be clamped between frictional clamping element 25 and ball transfer bearing 23. With this arrangement the fixed alignment clamp 30 effectively acts as a pivot point for the stencil support 14.

Figure 7:
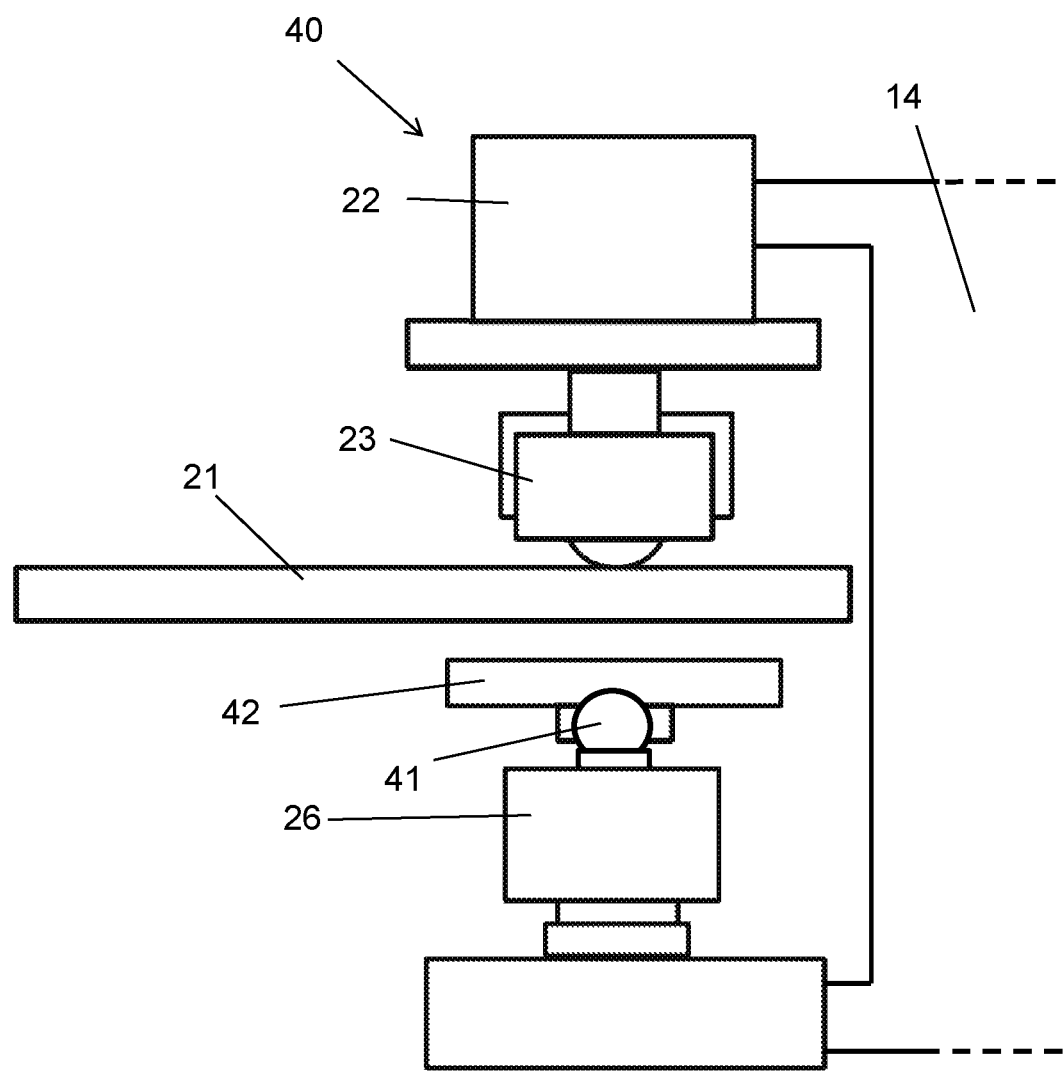
FIG. 7 schematically shows a movable alignment clamp in accordance with another embodiment of the present invention.

FIG. 7 schematically shows a movable alignment clamp 40 in accordance with another embodiment of the present invention. This alignment clamp 40 has many parts in common with the movable alignment clamp 20 of FIG. 5, and the reference numerals have been retained where appropriate. The alignment clamp 40 differs from previously-described alignment clamp 20 in that here the frictional clamping element 25 is replaced by a rotatable element in the form of a ball joint 41, which carries a foot 42 with frictional material provided thereon. This alignment clamp 40 is operated in an identical fashion to alignment 20 as described above.

Figure 8:
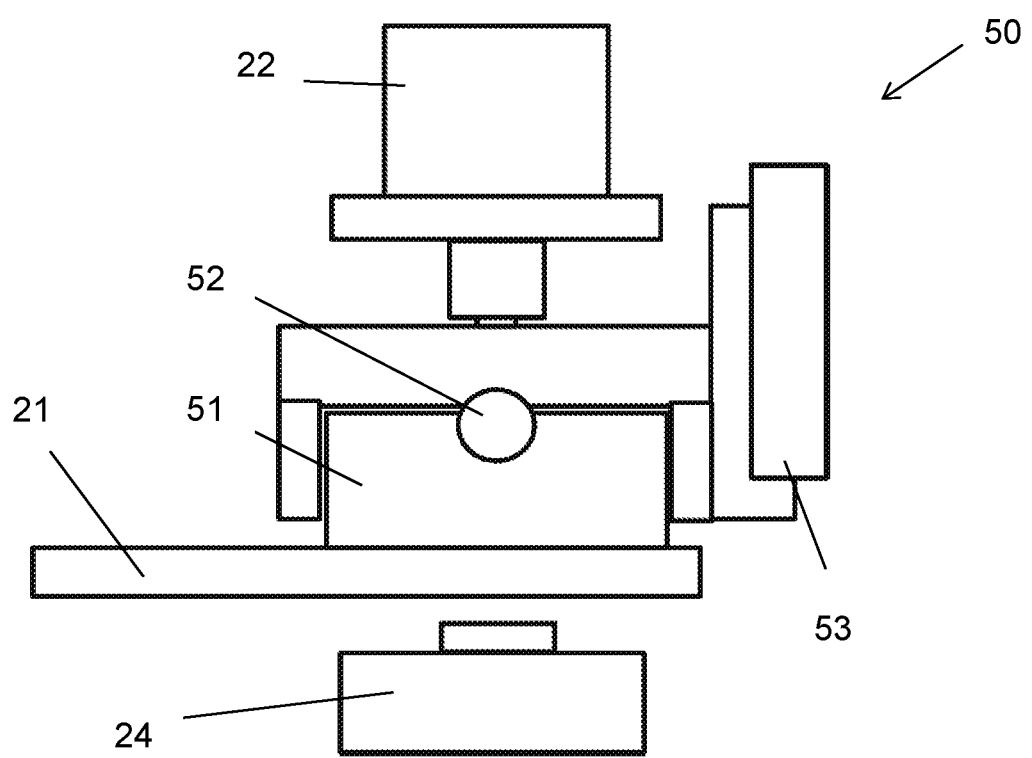
FIG. 8 schematically shows a movable alignment clamp in accordance with a further embodiment of the present invention.

FIG. 8 schematically shows a movable alignment clamp 50 in accordance with a further embodiment of the present invention. This alignment clamp 50 has many parts in common with the movable alignment clamp 20 of FIG. 5, and the reference numerals have been retained where appropriate. For clarity, the stencil support 14 is omitted from the figure. With this alignment clamp 50, the clamping actuator 24 is arranged to act directly on the lower surface of lug 21. To assist with clamping, frictional material may be applied to the upper mating face of clamping actuator 24. The upper part of alignment clamp 50 comprises an air bearing 51 which is mounted via a swivelling element, i.e. a swivel joint 52 to the planarity actuator 22. A linear guide 53 is provided to guide the air bearing 51 and swivel joint 52 arrangement, to accurately lift the stencil support during operation. To assist with clamping, frictional material may be applied to the lower mating face of air bearing 51. Use of such a swivel mounting enables the lug to be clamped along the clamping axis to be held at an inclined angle to the clamping axis.

Operation of the alignment clamp 50 is identical to that previously described with reference to FIGS. 5 and 7. It should be noted that while in this embodiment the upper part of the alignment clamp 50 does not include either a frictional clamping element or a ball joint, the low friction provided by air bearing 51 permits the necessary movement.

Figure 9:
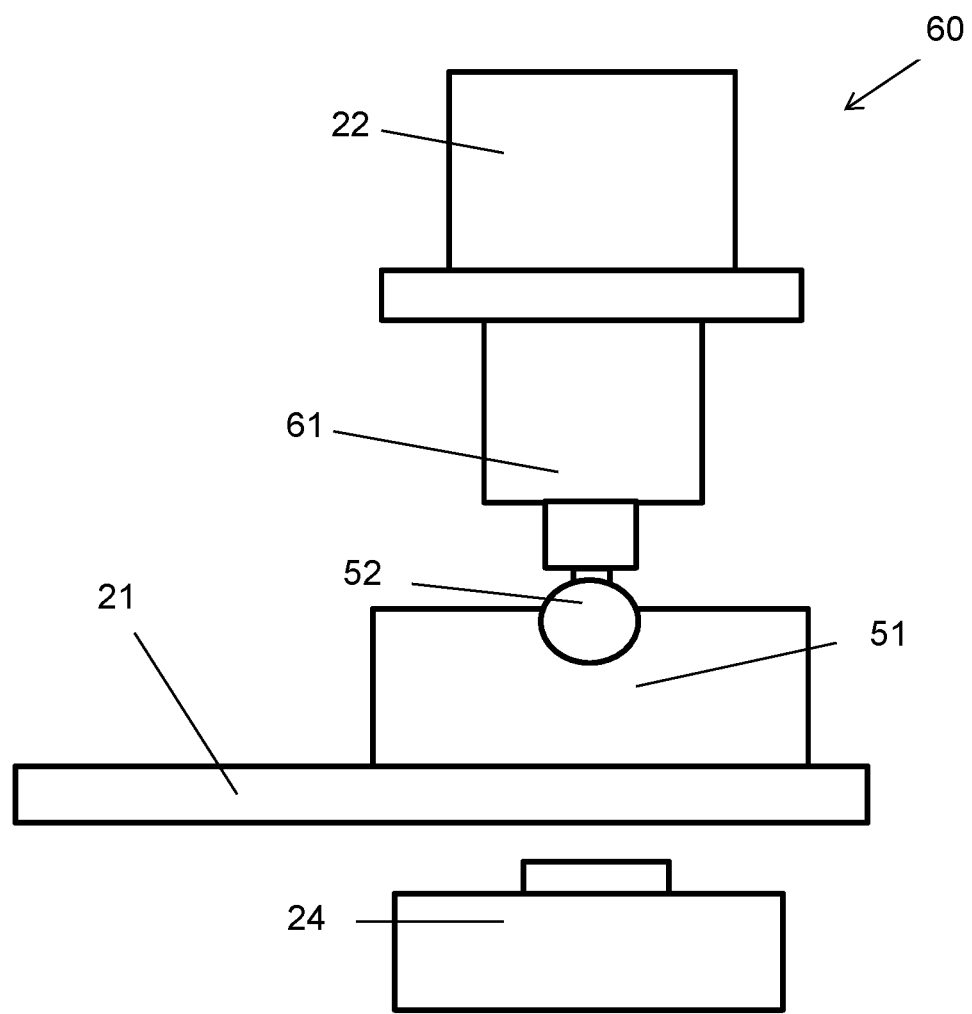
FIG. 9 schematically shows a movable alignment clamp in accordance with another embodiment of the present invention.

FIG. 9 schematically shows a movable alignment clamp 60 in accordance with another embodiment of the present invention. This alignment clamp 60 has many parts in common with the movable alignment clamp 50 of FIG. 8, and the reference numerals have been retained where appropriate. For clarity, the stencil support 14 is omitted from the figure. In this embodiment, the linear guide 53 of alignment clamp 50 is replaced by the use of a precision guide 61, which mechanically connects the swivel joint 52 and planarity actuator 22. The precision guide 61, which may for example comprise a ball spline, accurately guides the movement of air bearing 51 without the need for an external guide structure.

Figure 10:
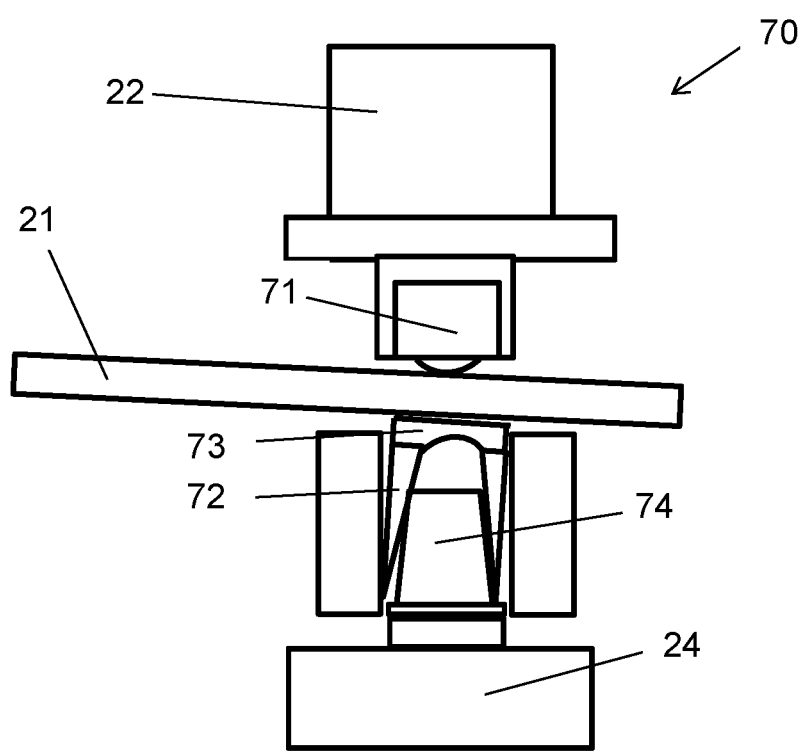
FIG. 10 schematically shows a movable alignment clamp in accordance with a yet further embodiment of the present invention.

FIG. 10 schematically shows a movable alignment clamp 70 in accordance with a yet further embodiment of the present invention. In FIG. 10 it should be noted that the lug 21 is shown in a rotated state. This alignment clamp 70 has many parts in common with the movable alignment clamp 20 of FIG. 5, and the reference numerals have been retained where appropriate. For clarity, the stencil support 14 is omitted from the figure. The upper part of alignment clamp 70 comprises a ball transfer bearing 71 mechanically connected to the output of planarity actuator 22. The lower part of alignment clamp 70 includes a rotatable element in the form of a collet arrangement in order to enable rotation of the lug 21. The clamping actuator 24 is mechanically connected to a collet expander 74, which takes the form of a frustoconical projection. This cooperates with a swivel collet 72, which takes the form of a cylinder having a frustoconical recess which is sized so as to receive the collet expander 74 while permitting relative movement therebetween. The swivel collet 72 carries at its distal end a friction plate 73, which contacts the lower surface of the lug 21 in use.

The above-described embodiments are exemplary only, and other possibilities and alternatives within the scope of the invention will be apparent to those skilled in the art. For example, the above-described embodiments show the clamping actuator located below the stencil support, with the planarity actuator located above the stencil support. It will be apparent to those skilled in the art that this arrangement could be inverted, so that the planarity actuator is located below the stencil support and the clamping actuator located above.

The above-described embodiments disclose the use of linear actuators. Other forms of actuator which result in movement along the Z-axis may alternatively be used. For example, a "Z-lift" arrangement, in which horizontal movement is translated into vertical movement either using a cam arrangement or a wedge, scissor mechanism or electric drive as is known in the art, may replace a linear actuator.

The linearity of the actuator movement is not essential as long as a component of movement in the Z-direction is produced, and so a linear actuator may instead be driven through a curved bearing.

The above-described embodiments disclose alignment systems in which a plurality of alignment clamps, each including a planarity actuator, are provided, which are spaced around the alignment frame. It is possible instead to use a system in which a single linear actuator drives, along the Z-axis, a common member which in turn supports two spaced engagement surfaces for the alignment frame. The common member may be driven, for example rotated, by a second actuator so as to control the relative heights of the two engagement surfaces, and thus the rotation of the alignment frame.

As previously suggested, in the specific embodiments described above, the alignment frame comprises the stencil support. Equally however, the alignment frame could comprise the workpiece support, to provide relative rotation of the stencil support and workpiece support.

Instead of four measurement sensors, could use one or two movable sensors which take a reading in a first position, then move to a second position and take a second measurement. In such embodiments each measurement sensor may be mounted on a gantry which may move over and relative to the workpiece support.

In the above-described embodiments, the printing machine is calibrated by measuring a reference position of the workpiece support, so that this is used as a datum. Alternatively, a reference position of the workpiece may be measured and used in this way.

REFERENCE NUMERALS

1—Known alignment system
2—Stencil support
3—Stencil
4—Workpiece support
5—Front measurement sensors
6—Rear measurement sensors
7, 8—X alignment actuators
9—Y alignment actuator
7'—X alignment actuator
8', 9'—Y alignment actuators
10—Alignment system
11, 12, 13—Z alignment clamps
14—Stencil support
15—Workpiece
16—Stencil frame
17—Misalignment cause
20, 40, 50, 60, 70—Movable alignment clamp
21—Lug
22—Planarity actuator
23—Ball transfer bearing
24—Clamping actuator
25—Frictional clamping element
26—Linear guide
30—Fixed alignment clamp
31—Static nut
41—Ball joint
51—Air bearing
52—Swivel joint
53—Linear guide
54—Frictional material
61—Precision guide
71—Ball transfer bearing
72—Swivel collet
73—Friction plate
74—Collet expander

The invention claimed is:

1. An alignment system for a workpiece printing machine, comprising:
    a stencil support for supporting a substantially planar stencil in use,
    a workpiece support for supporting a planar workpiece in an X-Y plane in use, the X-Y plane being defined as that plane which includes orthogonal X and Y axes,
    a planarity control mechanism comprising an actuator arranged to effect relative rotation of the stencil support and workpiece support about at least one of the X and Y axes, wherein the planarity control mechanism comprises at least two actuators arranged to effect relative rotation of the stencil support and workpiece support about both of the X and Y axes, and
    first and second movable alignment clamps, each of the first and second movable alignment clamps comprising a respective actuator, and which is located at respective first and second spaced locations on an alignment frame.

2. The alignment system of claim 1, comprising a fixed alignment clamp located at a third location on the alignment frame, such that the fixed alignment clamp acts as a pivot for the alignment frame.

3. The alignment system of claim 1, comprising a third movable alignment clamp located at a third location on the alignment frame.

4. The alignment system of claim 1, further comprising an X-Y alignment mechanism in mechanical cooperation with the alignment frame for moving the alignment frame within the X-Y plane.

5. The alignment system of claim 4, wherein each movable alignment clamp comprises a respective bearing, said movable alignment clamp in use mechanically cooperating with a respective external surface lying in a plane parallel to the X-Y plane via the said respective bearing to enable movement of the alignment frame in the X-Y plane.

6. The alignment system of claim 5, wherein each actuator is operative to raise or lower the alignment frame relative to, and in reaction against, the respective external surface.

7. The alignment system of claim 5, wherein each movable alignment clamp comprises a clamping actuator operable to clamp the said movable alignment clamp to the respective external surface.

8. The alignment system of claim 1, wherein the alignment frame comprises the stencil support.

9. The alignment system of claim 1, wherein the alignment frame comprises the workpiece support.

10. The alignment system of claim 1, wherein the planarity control mechanism comprises a clamp assembly, the clamp assembly comprising:
    first and second mutually opposed clamping surfaces for clamping a rigid structure therebetween, and
    a clamping actuator on which the first clamping surface is mounted, operative to switch the clamp assembly between a first, unclamped state and a second, clamped state in which clamped state said rigid structure is clamped between the first and second clamping surfaces, said switching being effected by the clamping actuator moving the first clamping surface along a clamping axis towards the second clamping surface, wherein at least one of the first and second clamping surfaces comprises a bearing, such that the rigid structure is movable relative to the said clamping surface via said bearing when the clamp assembly is in the first, unclamped state;

a positioning actuator mechanically connected to the second clamping surface, for moving part of the clamp assembly relative to the second clamping surface, along the clamping axis; and the positioning actuator of the clamp assembly being arranged to effect rotation of the alignment frame.

11. The alignment system of claim 10, wherein one of the first and second clamping surfaces comprises a bearing, and the other one of the first and second clamping surfaces comprises a domed or swiveling frictional element, such that the rigid structure may be clamped along the clamping axis to be held at an inclined angle to the clamping axis.

12. The alignment system of claim 10, wherein the positioning actuator comprises a linear actuator.

13. The alignment system of claim 12, wherein the clamp assembly comprises a curved bearing and the linear actuator drives the curved bearing in use.

14. A printing machine comprising the alignment system of claim 1.

15. The printing machine of claim 14, comprising a supporting structure, the supporting structure comprising a plurality of lugs projecting therefrom, and the planarity control mechanism mechanically cooperates with the supporting structure via said lugs.

16. The printing machine of claim 14, further comprising a sensor arrangement for measuring the distance of a plurality of points of the stencil relative to the X-Y plane, when the stencil is supported by the stencil support.

17. A method for printing a planar workpiece with a conductive medium, comprising the steps of:
 i) providing a printing machine having a workpiece support for supporting a planar workpiece in an X-Y plane, and a stencil support for supporting a substantially planar stencil,
 ii) loading a stencil into the stencil support,
 iii) measuring the distance of a plurality of points of the stencil relative to the X-Y plane,
 iv) rotating the stencil support relative to the workpiece support about at least one of the X and Y axes until the stencil is at a required orientation to the X-Y plane,
 v) loading a workpiece onto the workpiece support such that it is located below the stencil, and
 vi) printing conductive medium onto the workpiece via the stencil,
wherein step i) comprises providing a printing machine in accordance with claim 14.

* * * * *